US012602035B2

(12) United States Patent
Maske et al.

(10) Patent No.: US 12,602,035 B2
(45) Date of Patent: Apr. 14, 2026

(54) SYSTEMS AND METHODS FOR DEFINING A SENSOR LAYOUT FOR PALLET ROUTING IN A MANUFACTURING ENVIRONMENT

(71) Applicant: Ford Global Technologies, LLC, Dearborn, MI (US)

(72) Inventors: Harshal Maske, Farmington Hills, MI (US); Devesh Upadhyay, Canton, MI (US); Jim Birley, Bingham Farms, MI (US); Dimitar Petrov Filev, Novi, MI (US); Justin Miller, Berkley, MI (US); Robert Bennett, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1148 days.

(21) Appl. No.: 17/558,804

(22) Filed: Dec. 22, 2021

(65) Prior Publication Data

US 2023/0195093 A1 Jun. 22, 2023

(51) Int. Cl.
G05B 19/418 (2006.01)
G06F 30/20 (2020.01)
G06Q 10/0631 (2023.01)

(52) U.S. Cl.
CPC ......... G05B 19/4189 (2013.01); G06F 30/20 (2020.01); G05B 2219/32391 (2013.01); G06Q 10/06313 (2013.01)

(58) Field of Classification Search
CPC ........ G05B 19/418; G05B 2219/32392; G06F 30/20; G06Q 10/06313
USPC .......................................................... 703/6
See application file for complete search history.

(56) References Cited

U.S. PATENT DOCUMENTS

2020/0393820 A1 12/2020 Lee et al.
2021/0253352 A1 8/2021 Eckman et al.

FOREIGN PATENT DOCUMENTS

CN            112149987            12/2020
WO     WO-2011140568 A2 *  11/2011   ........... G06Q 10/087

OTHER PUBLICATIONS

Ricondo_2021 (A digital twin framework for the simulation and optimization of product systems, 54th CIRP Conference on Manufacturing Systems, Nov. 26, 2021) (Year: 2021).*

(Continued)

*Primary Examiner* — Brian S Cook
(74) *Attorney, Agent, or Firm* — Burris Law, PLLC

(57)                ABSTRACT

A method includes defining a sensor layout of a digital twin based on sensor parameters and routing control locations of the digital twin. The method includes simulating a manufacturing routine of a plurality of pallets and a plurality of workstations based on one or more pallet parameters associated with the plurality of pallets and one or more workstation parameters associated with the plurality of workstations and calculating, for each routing control location from among the one or more routing control locations, a transient production value and a steady state production value based on the manufacturing routine. The method includes iteratively adjusting the sensor layout of the digital twin until each transient production value is less than or equal to a threshold transient production value and each steady state production value is less than or equal to a threshold steady state production value.

15 Claims, 4 Drawing Sheets

(56)             References Cited

OTHER PUBLICATIONS

Viti_2008 (sensor locations for reliable travel time prediction and dynamic management of traffic networks, Transportation Research Record: Journal of the Transportation Research Board, No. 2049 2008) (Year: 2008).*

Viti_2014 (Assessing partial observability in network sensor location problems, Transportation Research Part B 70, 2014 65-89) (Year: 2014).*

Bergman_2018 (Optimizing a production line, a simulation study, University of Twente, 2018) (Year: 2018).*

Park, et al., Digital Twin and Reinforcement Learning-Based Resilient Production Control for Micro Smart Factory, Applied Sciences, Mar. 26, 2021, 20 pages, vol. 11, 2977, MPDI, Switzerland.

Hofmann, et al., Digital Twin for Assembly Line Supply Strategy Planning: A Case Study on Reinforcement-Learning in Logistics, Mar. 21, 2020, 9 pages.

* cited by examiner

SYSTEMS AND METHODS FOR DEFINING A SENSOR LAYOUT FOR PALLET ROUTING IN A MANUFACTURING ENVIRONMENT

FIELD

The present disclosure relates to systems and methods for defining a sensor layout for pallet routing in a manufacturing environment.

BACKGROUND

The statements in this section merely provide background information related to the present disclosure and may not constitute prior art.

In a manufacturing environment, operators and machines may provide semi-finished and finished workpieces on various pallets that autonomously navigate between a plurality of workstations that perform manufacturing operations. For example, when approaching or leaving a workstation, the pallets may autonomously merge paths or split paths according to a manufacturing routine. However, bottlenecks associated with pallet merging and splitting operations may inhibit the efficiency of the manufacturing routine. As such, a plurality of sensors disposed throughout the environment may be configured to detect the pallets and provide information to a controller that is configured to dynamically adjust the manufacturing routine and remediate the bottlenecks. However, identifying a sensor layout that enables the controller to detect the pallets while satisfying time and performance-based constraints is a resource-intensive and tedious process. These issues with identifying a desired sensor layout, among other issues, are addressed by the present disclosure.

SUMMARY

This section provides a general summary of the disclosure and is not a comprehensive disclosure of its full scope or all of its features.

The present disclosure provides a method that includes defining a sensor layout of a digital twin based on one or more sensor parameters and one or more routing control locations of the digital twin, where the sensor layout includes a plurality of sensors. The method includes simulating a manufacturing routine of a plurality of pallets and a plurality of workstations of the digital twin based on one or more pallet parameters associated with the plurality of pallets and one or more workstation parameters associated with the plurality of workstations and calculating, for each routing control location from among the one or more routing control locations, a transient production value and a steady state production value based on the manufacturing routine. The method includes iteratively adjusting the sensor layout of the digital twin until each transient production value from among the one or more transient production values is less than or equal to a threshold transient production value and each steady state production value from among the one or more steady state production values is less than or equal to a threshold steady state production value.

In one form, the transient production value and the steady state production value are based on a first target production value associated with a first type of pallets from among the plurality of pallets and a second target production value associated with a second type of pallets from among the plurality of pallets. In one form, the transient production value is based on a first number of the first type of pallets and a second number of the second type of pallets located between a first routing control location from among the one or more routing control locations and a destination. In one form, the transient production value is based on a routing control location ratio and a production ratio, the routing control location ratio is based on a ratio of the first number and a sum of the first number and the second number, and the production ratio is based on a ratio of the first target production value and a sum of the first target production value and the second target production value. In one form, the steady state production value is based on a first number of the first type of pallets and a second number of the second type of pallets provided that have passed through the one or more routing control locations.

In one form, the steady state production value is based on a routing control location ratio and a production ratio, the routing control location ratio is based on a ratio of the first number and a sum of the first number and the second number, and the production ratio is based on a ratio of the first target production value and a sum of the first target production value and the second target production value. In one form, the one or more sensor parameters include a predetermined number of sensors of the plurality of sensors. In one form, the one or more pallet parameters include a pallet merging time associated with each routing control location of the one or more routing control locations, a pallet splitting time associated with each routing control location of the one or more routing control locations, one or more pallet travel times between the one or more routing control locations, or a combination thereof. In one form, the one or more workstation parameters include a cycle time associated with each workstation from among the plurality of workstations, a downtime associated with each workstation from among the plurality of workstations, or a combination thereof. In one form, adjusting the sensor layout further comprises adjusting a number of the plurality of sensors in the digital twin, adjusting a placement of the plurality of sensors in the digital twin, or a combination thereof.

The present disclosure provides a system including a processor and a nontransitory computer-readable medium including instructions that are executable by the processor. The instructions include defining a sensor layout of a digital twin based on one or more sensor parameters and one or more routing control locations of the digital twin, where the sensor layout includes a plurality of sensors. The instructions include simulating a manufacturing routine of a plurality of pallets and a plurality of workstations of the digital twin based on one or more pallet parameters associated with the plurality of pallets and one or more workstation parameters associated with the plurality of workstations, where the one or more pallet parameters include a pallet merging time associated with each routing control location of the one or more routing control locations, a pallet splitting time associated with each routing control location of the one or more routing control locations, one or more pallet travel times between the one or more routing control locations, or a combination thereof. The instructions include calculating, for each routing control location from among the one or more routing control locations, a transient production value and a steady state production value based on the manufacturing routine, determining whether the transient production value is greater than a threshold transient production value, and determining whether the steady state production value is greater than a threshold steady state production value. The instructions include adjusting the sensor layout of the digital twin when one of the transient production value is greater than the threshold transient production value and the steady state production value is greater than the threshold steady state production value.

The present disclosure provides a method including defining a sensor layout of a digital twin based on one or more sensor parameters and one or more routing control locations of the digital twin, where the sensor layout includes a plurality of sensors and simulating a manufacturing routine of a plurality of pallets and a plurality of workstations of the digital twin based on one or more pallet parameters associated with the plurality of pallets and one or more workstation parameters associated with the plurality of workstations. The one or more pallet parameters include a pallet merging time associated with each routing control location of the one or more routing control locations, a pallet splitting time associated with each routing control location of the one or more routing control locations, one or more pallet travel times between the one or more routing control locations, or a combination thereof. The one or more workstation parameters include a cycle time associated with each workstation from among the plurality of workstations, a downtime associated with each workstation from among the plurality of workstations, or a combination thereof. The method includes calculating, for each routing control location from among the one or more routing control locations, a transient production value and a steady state production value based on the manufacturing routine, where the transient production value and the steady state production value are based on a first target production value associated with a first type of pallets from among the plurality of pallets and a second target production value associated with a second type of pallets from among the plurality of pallets. The method includes iteratively adjusting the sensor layout of the digital twin until each transient production value from among the one or more transient production values is less than or equal to a threshold transient production value and each steady state production value from among the one or more steady state production values is less than or equal to a threshold steady state production value, where adjusting the sensor layout comprises adjusting a number of the plurality of sensors in the digital twin, adjusting a placement of the plurality of sensors in the digital twin, or a combination thereof.

In one form, the transient production value is based on a first number of the first type of pallets, a second number of the second type of pallets located between a first routing control location from among the one or more routing control locations and a destination, a routing control location ratio, and a production ratio. The routing control location ratio is based on a ratio of the first number and a sum of the first number and the second number. The production ratio is based on a ratio of the first target production value and a sum of the first target production value and the second target production value. In one form, the steady state production value is based on a first number of the first type of pallets, a second number of the second type of pallets provided at a destination, a routing control location ratio, and a production ratio. The routing control location ratio is based on a ratio of the first number and a sum of the first number and the second number, and the production ratio is based on a ratio of the first target production value and a sum of the first target production value and the second target production value.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
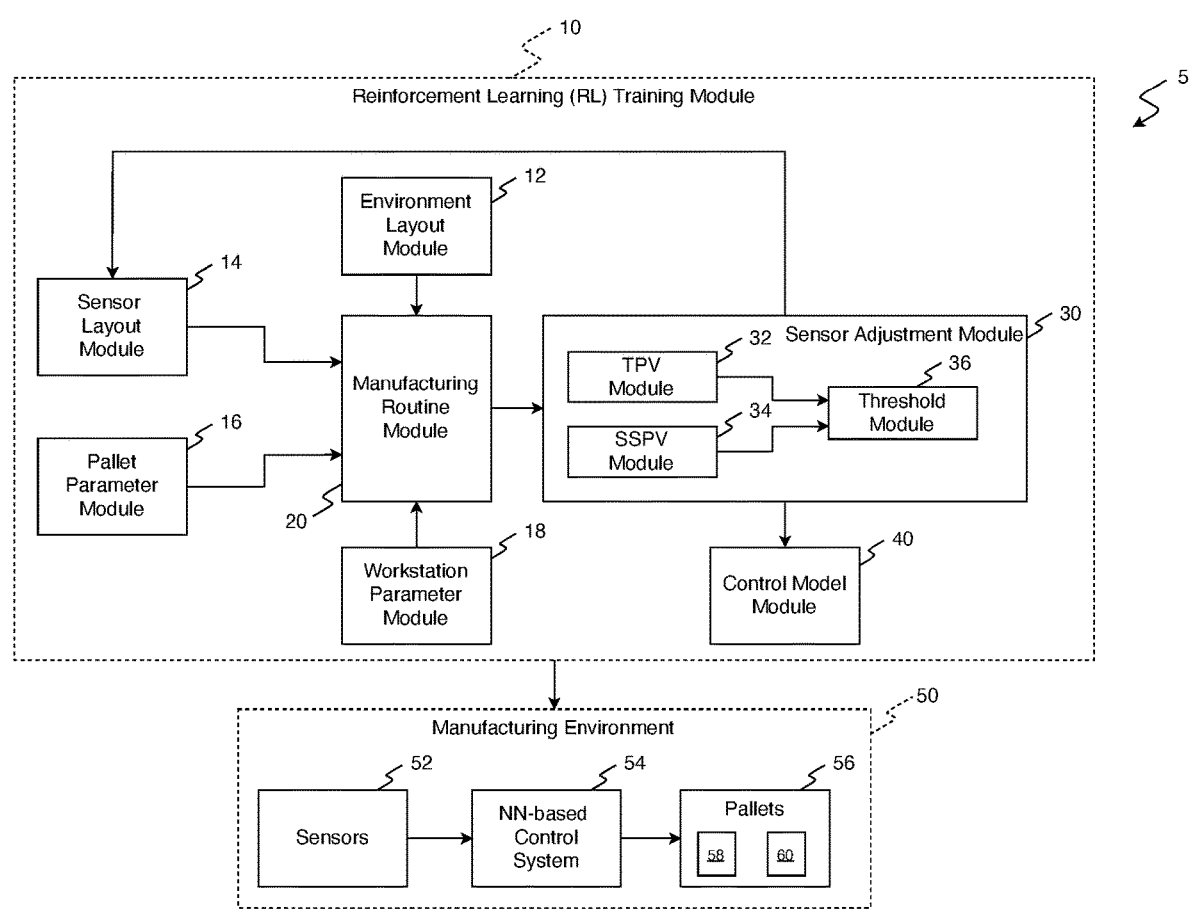
FIG. 1 is a block diagram of a system including a reinforcement learning training module and a manufacturing environment in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure provides systems and methods for defining a sensor layout of a manufacturing environment using a digital twin and reinforcement learning routines. A reinforcement learning training module simulates a manufacturing routine of a plurality of pallets and workstations for a given sensor layout and determines whether various transient reward and steady state reward criteria are satisfied. The reinforcement learning training module iteratively adjusts the sensor layout until both the transient and steady state rewards are satisfied. As such, the reinforcement learning routine optimizing the number of sensors needed in the manufacturing environment to accurately detect pallet counts at various routing control locations and therefore inhibits bottlenecks in the manufacturing routine and ensures various production conditions are satisfied.

Referring to FIG. 1, a system 5 for controlling defining a sensor layout is provided and generally includes a reinforcement learning (RL) training module 10 and a manufacturing environment 50. While the RL training module 10 is positioned remotely from the manufacturing environment 50, it should be understood that the RL training module 10 may be included as part of the manufacturing environment 50 in other forms. In one form, the RL training module 10 and the manufacturing environment 50 are communicably coupled using a wired and/or wireless communication protocol (e.g., a Bluetooth®-type protocol, a cellular protocol, a wireless fidelity (Wi-Fi)-type protocol, a near-field communication (NFC) protocol, an ultra-wideband (UWB) protocol, among others).

In one form, the manufacturing environment 50 includes sensors 52, a neural-network-based (NN-based) control system 54, and pallets 56. In form, the sensors 52 are configured to obtain identification and/or location information associated with the pallets 56 and track the pallets 56 as they traverse the manufacturing environment 50. As an example, the sensors 52 may be radio frequency identification (RFID) scanners configured to scan RFID tags disposed on the pallets 56. As another example, the sensors 52 may be imaging devices (e.g., a two-dimensional (2D) camera or a three-dimensional (3D) camera) configured to obtain images of fiducial markers disposed on the pallets 56 (e.g., quick response (QR) tags that include a unique 2D barcode uniquely identifying the pallets 56). As described below in further detail, the RL training module 10 is configured to define the number and positioning of the sensors 52.

In one form, the pallets 56 are configured to transport raw, semi-finished, and finished workpieces between various workstations/storage areas of the manufacturing environment 50. The pallets 56 may be pallets that are moveable along headrails and conveyors, two-way entry pallets, four-way entry pallets, open deck pallets, solid deck pallets, and/or double face pallets. In one form, the pallets 56 may include fixtures 58 that are configured to support and secure a workpiece thereto.

In one form, the pallets 56 are partially or fully autonomous and are configured to move to various locations within the manufacturing environment 50, as instructed by the NN-based control system 54. To autonomously move itself, the pallets 56 include a control system 60 to control various movement systems (e.g., propulsion systems, steering systems, and/or brake systems) based on one or more navigation sensors (e.g., a global navigation satellite system (GNSS) sensor, an imaging sensor, a local position sensor, among others) of the pallets 56 (not shown). To perform the functionality described herein, the control system 60 may include one or more processor circuits that are configured to execute machine-readable instructions stored in one or more nontransitory computer-readable mediums, such as a random-access memory (RAM) circuit and/or read-only memory (ROM) circuit. The control system 60 may also include other components for performing the operations described herein, such as, but not limited to, movement drivers and systems, transceivers, routers, and/or input/output interface hardware. It should be understood that the pallets 56 may not be autonomous and thus be moveable by forklift, vehicle, or conveyor/headrail of the manufacturing environment 50 in other forms.

In one form, the NN-based control system 54 is configured to instruct the pallets 56 to autonomously travel to various locations of the manufacturing environment 50 based on the sensor data obtained from the sensors 52 (i.e., the identification and/or location of the pallets 56). In one form, the NN-based control system 54 remotely and autonomously controls the pallets 56 as they travel to a respective location of the manufacturing environment 50 (e.g., controls the merging and splitting of the pallets 56 at various locations within the manufacturing environment 50). To perform the functionality described herein, the NN-based control system 54 may perform a deep reinforcement learning (DRL) routine. Accordingly, the DRL routine is trained based on actions performed by the agents and a reward associated with the action (e.g., whether the various actions of the pallets 56 satisfy one or more time constraints associated with the manufacturing routine). Furthermore, to train the DRL learning routine performed by the NN-based control system 54 (e.g., maximize the rewards of the DRL learning routine), the RL training module 10 may iteratively modify the sensor layout of the sensors 52, as described below in further detail.

In one form, the RL training module 10 includes an environment layout module 12, a sensor layout module 14, a pallet parameter module 16, a workstation parameter module 18, a manufacturing routine module 20, a sensor adjustment module 30, and a control model module 40. It should be readily understood that any one of the components of the RL training module 10 can be provided at the same location or distributed at different locations (e.g., via one or more edge computing devices) and communicably coupled accordingly. To perform the functionality described herein, the RL training module 10 may include a human-machine-interface (HMI) (e.g., a touchscreen display, monitor, among others) and/or input devices (e.g., mouse, keyboard, among others) that enable an operator to generate inputs corresponding to the described functionality.

In one form, the environment layout module 12 is configured to generate a digital twin of the manufacturing environment 50. As used herein, a "digital twin" may refer to a virtual representation of various components and systems of the manufacturing environment 50, such as one or more workstations (not shown), the pallets 56, the sensors 52, among other components and systems. The virtual representation may be, for example, a dynamic simulation model of the manufacturing environment 50 (e.g., a discrete event simulation model of the manufacturing environment 50). As described below in further detail, the virtual representation may also include historical operation data associated with the components and systems of the manufacturing environment 50 when a manufacturing routine is being simulated by the manufacturing routine module 20.

In one form, the environment layout module 12 is configured to define one or more routing control locations of the digital twin. As used herein, "routing control locations" refer to locations within the digital twin in which virtual pallets perform a pallet merging operation and/or a pallet splitting operation. As used herein, "pallet merging operation" refers to an operation in which one or more first virtual pallets traveling along a first path and one or more additional virtual pallets traveling along one or more additional paths are merged such that at least a set of the first virtual pallets and a set of the additional virtual pallets travel along a new path. As used herein, "pallet splitting operation" refers to an operation in which a plurality of virtual pallets traveling along a path are split such that a first set of the plurality of pallets travels along a first new path and a second set of the plurality of pallets travels along a second new path.

Figure 2:
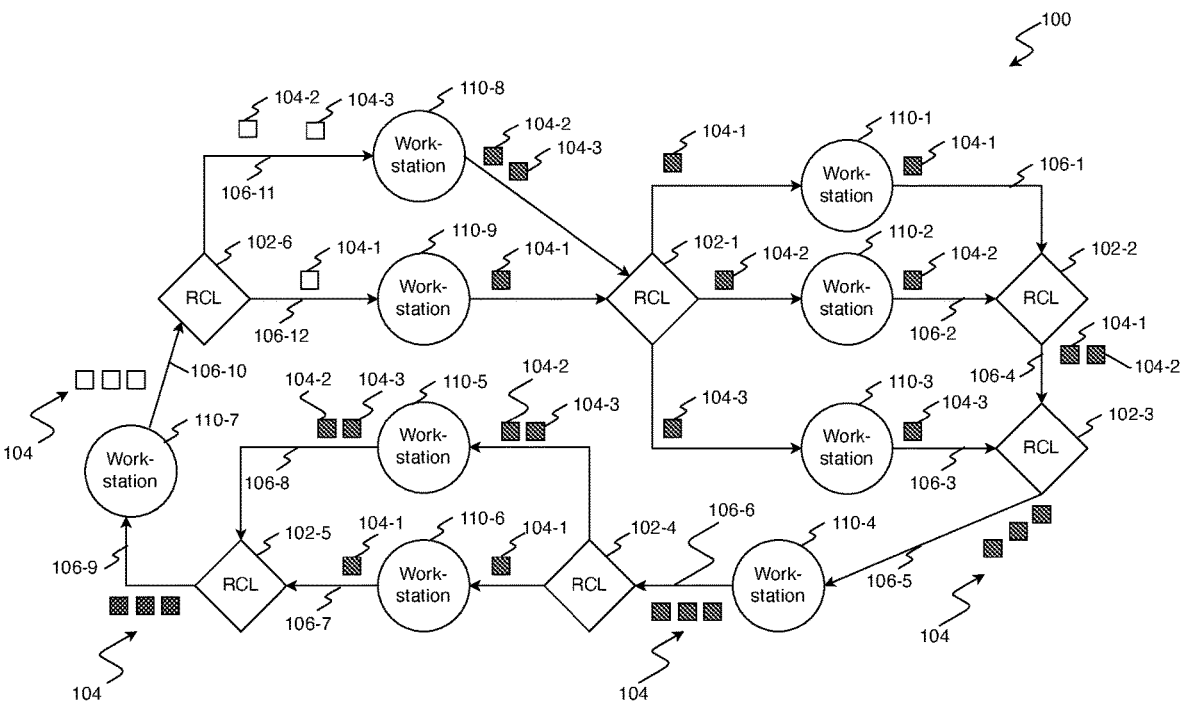
FIG. 2 is a block diagram of a digital twin of a manufacturing environment in accordance with the teachings of the present disclosure.

As an example and referring to FIG. 2, which illustrates a digital twin 100 of the manufacturing environment 50, the environment layout module 12 defines routing control locations 102-1, 102-2, 102-3, 102-4, 102-5, 102-6 (collectively referred to as "routing control locations 102") at which a pallet merging operation and/or pallet splitting operation can be performed. Specifically, a pallet merging operation can be performed at the routing control locations 102-1, 102-2, 102-3, 102-5. For example, pallets 104-1, 104-2 traveling along paths 106-1, 106-2 can be merged at the routing control location 102-2 such that the pallets 104-1, 104-2 travel along path 106-4. Furthermore, a pallet splitting operation can be performed at the routing control locations 102-1, 102-4, 102-6. For example, pallets 104-1, 104-2, 104-3 traveling along paths 106-11, 106-12 can be split at the routing control location 102-1 such that the pallets 104-1, 104-2, 104-3 travel along paths 106-1, 106-2, 106-3, respectively. Additionally, both a pallet merging operation and a pallet splitting operation can be performed at the routing control location 102-1. The pallets 104-1, 104-2, 104-3 may be collectively referred to herein as "pallets 104," and paths 106-1, 106-2, 106-3, 106-4, 106-5, 106-6, 106-7, 106-8, 106-9, 106-10, 106-11, 106-12 may be collectively referred to herein as "paths 106."

Figure 3:
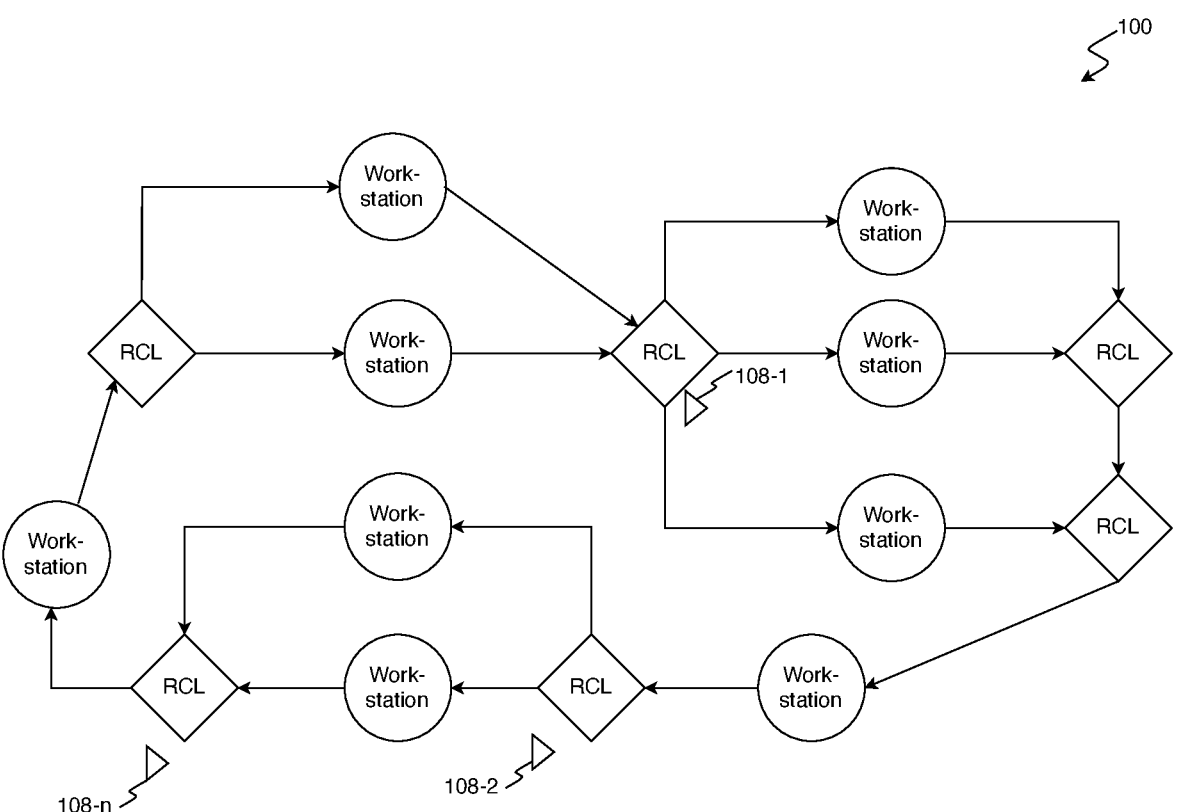
FIG. 3 is a block diagram of a digital twin of a sensor layout of a manufacturing environment in accordance with the teachings of the present disclosure.

In one form and referring to FIGS. 1 and 3, the sensor layout module 14 is configured to define a sensor layout including one or more sensors **108-1, 108-2, . . . 108-*n* (collectively referred to hereinafter as "sensors 108") of the digital twin 100 based on one or more sensor parameters. In one form, the sensor parameters include a predetermined number of sensors (e.g., a minimum and maximum number of sensors 108 in accordance with resource-based constraints), a type of sensor, sensor placement rules (e.g., the sensors 108 can only be placed at the routing control locations 102), and/or feedback information provided by the sensor adjustment module 30. As an example, the sensor layout module 14 initially defines the sensor layout such that the minimum number of sensors 108 are placed at one or more of the routing control locations 102 (e.g., the routing control locations 102-1, 102-2, 102-3, 102-4 represent the minimum of sensor locations of the digital twin 100**).

In one form, the pallet parameter module 16 is configured to define one or more pallet parameters associated with the pallets 104. The pallet parameters may include a pallet merging time associated with each routing control location 104, a pallet splitting time associated with each routing control location 104, and/or pallet travel times between the routing control locations 104. As used herein, "pallet merging time" refers to an amount of time needed to perform the pallet merging operation, and "pallet splitting time" refers to an amount of time needed to perform the pallet splitting operation. As used herein, "pallet travel time" refers to an amount of time needed for the pallet 104 to travel between a pair of routing control locations 102.

In one form, the workstation parameter module 18 is configured to define one or more workstations 110-1, 110-2, 110-3, 110-4, 110-5, 110-6, 110-7, 110-8, 110-9 (collectively referred to hereinafter as "workstations 110") of the digital twin 100 and one or more workstation parameters associated with the workstations 110. The workstation parameters may include a cycle time and/or downtime associated with each workstation 110. In one form, the cycle time and/or downtime are arbitrarily or stochastically defined by an operator or defined based on empirical/historical cycle time/downtime data associated with the workstations of the manufacturing environment 50. Additionally, the workstation parameters may include a type of workstation 110, a manufacturing operation performed at the workstation 110 (e.g., a pallet loading/unloading operation, a workpiece transformation operation, among others), robot parameters/mobility characteristics associated with one or more robots located at the workstation 110, conveyor/fixture operational characteristics, among other workstation parameters. As an example, the workstation parameters may indicate that a pallet unloading operation is performed at the workstation 110-7, a pallet loading operation is performed at the workstations 110-8, 110-9, and a workpiece transformation operation is performed at the remaining workstations 110-1, 110-2, 110-3, 110-4, 110-5, 110-6.

In one form, the manufacturing routine module 20 is configured to simulate a manufacturing routine of the pallets 104 and the workstations 110 based on the sensor layout of the sensors 108, the pallet parameters, and the workstation parameters. As an example, the manufacturing routine module 20 simulates the pallets 104 traversing from the routing control location 102-1 to a given destination, such as the workstation 110-7 (e.g., a storage location where the finished workpieces of the pallets 104 are unloaded) or the workstations 110-8, 110-9 (e.g., a storage location where unloaded pallets 104 are loaded with workpieces) via the one or more of the paths 106, one or more of the workstations 110, and one or more additional routing control locations 102 where the pallet merging/splitting operations are performed. In some forms, the manufacturing routine module 20 may perform known manufacturing simulation routines to simulate the manufacturing routine of the pallets 104 and the workstations 110.

In one form, the sensor adjustment module 30 includes a transient production value (TPV) module 32, a steady state production value (SSPV) module 34, and a threshold module 36. In one form, the TPV module 32 is configured to calculate a TPV of each routing control location 102 during the simulated manufacturing routine. The transient production value corresponds to transient rewards of the simulated manufacturing routine at the given routing control location and is represented as an objective function. In one form, the TPV module 32 calculates the TPV for the routing control location 102-2 based on the following relation:

$$TPV_{102\text{-}2} = -\left| \frac{d_1}{d_1 + d_2} - \frac{x_1}{x_1 + x_2} \right| \qquad (1)$$

In relation (1), $d_1$ is a first target production value associated with a first type of pallets 104, and $d_2$ is a second target production value associated with a second type of pallets 104. In one form, the first type of pallets 104 arrive at the routing control location 102-2 along a first path 106 (e.g., path 106-1), and the second type of pallets 104 arrive at the routing control location 102-2 along a second path 106 (e.g., path 106-2). Furthermore, in relation (1), the first and second target production values ($d_1$ and $d_2$) collectively form a production ratio that is based on the first production ratio and a sum of the first and second production ratios. As used herein, "target production value" refers to a number of pallets 104 of the given type that need to traverse from a defined origin (e.g., the routing control location 102-2) and the destination (e.g., the workstation 110-7) along the paths 106 to satisfy predefined time and/or production-based constraints.

In relation (1), $x_1$ is a number of pallets 104 that are classified as the first type of pallets 104 located between the routing control location 102-2 and the destination, as indicated by the sensors 108, and $x_2$ is a number of pallets 104 that is classified as the second type of pallets 104 located between the routing control location 102-2 and the destination, as indicated by the sensors 108. Furthermore, in relation (1), the numbers of the first and second types of pallets 104 ($x_1$ and $x_2$) collectively form a transient routing control location ratio that is based on the number of pallets 104 that are classified as the first type of pallets 104 ($x_1$) and a sum of the number of the first and second types of pallets 104.

In one form, when more than two types of pallets 104 exist (e.g., the pallets 104 can travel along n paths 106 to arrive at one of the routing control locations 102, where n>2), the TPV module 32 calculates the TPV for the routing control location 102 based on the following relation:

$$TPV_{102} = -\left| \frac{d_1}{d_1 + d_2 + \dots\ d_n} - \frac{x_1}{x_1 + x_2 + \dots\ x_n} \right| \qquad (2)$$

In relation (2), $d_n$ is an nth target production value associated with an nth type of pallets 104, and the first, second, and nth target production values collectively form a production ratio that is based on the first production ratio and a sum of the first, second, and nth production ratios. In relation (2), $x_n$ is a number of pallets 104 that are classified as the nth type of pallets 104 located between the given routing control location 102 and a predefined destination, as indicated by the sensors 108. Furthermore, in relation (2), the numbers of the first, second, and nth types of pallets 104 collectively form a transient routing control location ratio that is based on the a number of pallets 104 that are classified as the first type of pallets 104 ($x_1$) and a sum of the number of the first, second, and nth types of pallets 104.

In one form, the SSPV module 34 is configured to calculate a SSPV of each routing control location 102 during the simulated manufacturing routine. The transient production value corresponds to steady state rewards of the simulated manufacturing routine at the given routing control location and is represented as an objective function. In one form, the SSPV module 34 calculates the SSPV for the routing control location 102-1 based on the following relation:

$$SSPV_{102-1} = -\left| \frac{d_1}{d_1 + d_2} - \frac{c_1}{c_1 + c_2} \right| \quad (3)$$

In relation (3), $c_1$ is a number of pallets 104 that are classified as the first type of pallets 104 that have passed through the given routing control location, and $c_2$ is a number of pallets 104 that are classified as the second type of pallets 104 located that have passed through the given routing control, as indicated by the sensors 108. Furthermore, in relation (3), the numbers of the first and second types of pallets 104 that have passed through the given routing control ($c_1$ and $c_2$) collectively form a steady state routing control location ratio that is based on the number of pallets 104 that are classified as the first type of pallets 104 ($c_1$) and a sum of the number of the first and second types of pallets 104.

In one form, when more than two types of pallets 104 exist (e.g., the pallets 104 can travel along n paths 106 to arrive at one of the routing control locations 102, where n>2), the SSPV module 34 calculates the SSPV for the routing control location 102 based on the following relation:

$$SSPV_{102} = -\left| \frac{d_1}{d_1 + d_2 + \dots \, d_n} - \frac{c_1}{c_1 + c_2 + \dots \, c_n} \right| \quad (4)$$

In relation (4), $d_n$ is an nth target production value associated with an nth type of pallets 104, and the first, second, and nth target production values collectively form a production ratio that is based on the first production ratio and a sum of the first, second, and nth production ratios. In relation (4), $c_n$ is a number of pallets 104 that are classified as the nth type of pallets 104 located that have passed through the given routing control, as indicated by the sensors 108. Furthermore, in relation (4), the numbers of the first, second, and nth types of pallets 104 collectively form a steady state routing control location ratio that is based on the a number of pallets 104 that are classified as the first type of pallets 104 ($c_1$) and a sum of the number of the first, second, and nth types of pallets 104.

In one form, the threshold module 36 is configured to determine whether the TPV and SSPV are less than a respective threshold value (i.e., a threshold TPV and a threshold SSPV). The threshold values for the TPV and SSPV may be equal or unequal. In one form, the threshold value for each of the TPV and the SSPV may be equal to (or approximately equal to) zero. Accordingly, comparing the TPV and the SSPV to the respective threshold enables the RL training module 10 to determine whether the sensor layout includes redundant sensors 108 and whether certain production constraints can be satisfied with the given sensor layout.

In one form, the control model module 40 is configured to iteratively adjust the sensor layout of the digital twin 100 until each TPV is less than or equal to a threshold TPV and each SSPV is less than or equal to the threshold SSPV. As an additional example, the sensor layout includes a predefined minimum number of the sensors 108, and the sensor layout is adjusted by adding one or more sensors 108 until a predefined maximum number of sensors is reached. As an example, the control model module 40 may adjust the number of sensors 108 and/or the placement of the sensors 108. Accordingly, the manufacturing routine module 20 may simulate the manufacturing routine of the pallets 104 and the workstations 110 of the digital twin 100 based on the updated sensor layout of the sensors 108, the one or more pallet parameters, and the one or more workstation parameters.

When the TPV and the SSPV are less than the respective threshold value, the control model module 40 is configured to define a sensor layout of the sensors 52 to correspond to the given sensor layout of the sensors 108 of the digital twin 100. As an example, the control model module 40 is configured to broadcast, using the HMI, indicia (e.g., text, an image of the digital twin 100 and the given sensor layout of the sensors 108, and/or audible instructions) that instructs an operator to define and physically position the sensor layout of the sensors 52 of the manufacturing environment 50 in accordance with the sensor layout of the sensors 108 of the digital twin 100. Accordingly, the number and arrangement of the sensors 52 of the manufacturing environment 50 provides for accurate detection of pallet counts at various routing control locations of the manufacturing environment 50 and inhibits bottlenecks and optimizes the number of the sensors 52.

Figure 4:
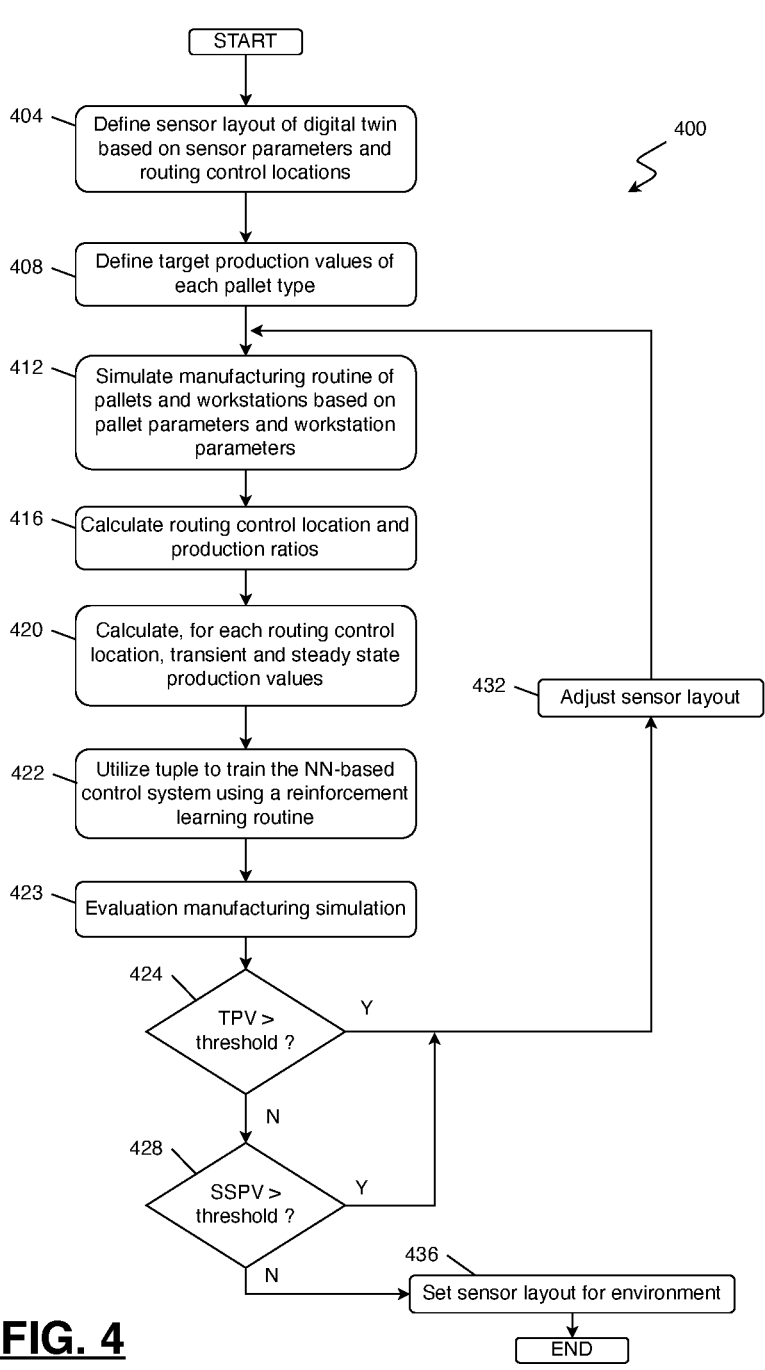
FIG. 4 is routine for defining a sensor layout of a manufacturing environment using reinforcement learning in accordance with the teachings of the present disclosure.

Referring to FIG. 4, a routine 400 for defining a sensor layout of the digital twin 100 of the manufacturing environment using reinforcement learning is shown. At 404, the RL training module 10 defines an initial sensor layout of the sensors 108 of the digital twin 100 based on the sensor parameters and the routing control locations 102 of the digital twin 100. At 408, the RL training module 10 defines the target production values for each type of pallets 104, and the RL training module 10 simulates the manufacturing routine of the pallets 104 and the workstations 110 based on the pallet parameters and the workstation parameters, respectively, at 412. At 416, the RL training module 10 calculates the routing control location ratio and the production ratio, and the RL training module 10 calculates, for each routing control location 102, the TPV and SSPV at 420.

At 422, the RL training module 10 utilizes the tuple (i.e., the state, action, consequence state, and the sum of the transient and steady state functions for each routing control location 102 where the sensors 108 are placed) to train the NN-based control system 54 using a reinforcement learning routine until training is ended. At 423, the RL training module 10 evaluates the manufacturing simulation using the trained model obtained at 422. At 424, the RL training module 10 determines whether the TPV is greater than a threshold TPV. If so, the routine 400 proceeds to 432, where the RL training module 10 adjusts the sensor layout and proceeds to 412. Otherwise, if the TPV is less than the threshold TPV at 424, the routine 400 proceeds to 428, where the RL training module 10 determines whether the SSPV is greater than a threshold SSPV. If so, the routine 400 proceeds to 432. Otherwise, the routine 400 proceeds to 436, where the RL training module 10 sets the corresponding sensor layout for the manufacturing environment 50.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method comprising:

defining a sensor layout of a digital twin based on one or more sensor parameters and one or more routing control locations of the digital twin, wherein the sensor layout includes a plurality of sensors;

simulating a manufacturing routine of a plurality of pallets and a plurality of workstations of the digital twin based on one or more pallet parameters associated with the plurality of pallets and one or more workstation parameters associated with the plurality of workstations;

calculating, for each routing control location from among the one or more routing control locations, a transient production value and a steady state production value based on the manufacturing routine;

iteratively adjusting the sensor layout of the digital twin until:

each transient production value from among the one or more transient production values is less than or equal to a threshold transient production value; and each steady state production value from among the one or more steady state production values is less than or equal to a threshold steady state production value; and simulating the manufacturing routine of the plurality of pallets and the plurality of workstations of the digital twin based on the adjusted sensor layout, wherein the transient production value is equal to $|d_1/(d_1+d_2)-x_1/(x_1+x_2)|$, wherein $d_1$ is a first target production value associated with a first type of pallets from among the plurality of pallets, wherein $d_2$ is a second target production value associated with a second type of pallets from among the plurality of pallets, wherein $x_1$ is a number of the first type of pallets located between a given routing control location and a destination, and wherein $x_2$ is a number of the second type of pallets located between the given routing control location and the destination.

2. The method of claim 1, wherein the steady state production value is based on the first target production value and the second target production value.

3. The method of claim 2, wherein the steady state production value is based on the first number of the first type of pallets and the second number of the second type of pallets that have passed through the one or more routing control locations.

4. The method of claim 3, wherein:

the steady state production value is based on a routing control location ratio and a production ratio;

the routing control location ratio is based on a ratio of the first number and a sum of the first number and the second number; and the production ratio is based on a ratio of the first target production value and a sum of the first target production value and the second target production value.

5. The method of claim 1, wherein the one or more sensor parameters include a predetermined number of sensors of the plurality of sensors.

6. The method of claim 1, wherein the one or more pallet parameters include a pallet merging time associated with each routing control location of the one or more routing control locations, a pallet splitting time associated with each routing control location of the one or more routing control locations, one or more pallet travel times between the one or more routing control locations, or a combination thereof.

7. The method of claim 1, wherein the one or more workstation parameters include a cycle time associated with each workstation from among the plurality of workstations, a downtime associated with each workstation from among the plurality of workstations, or a combination thereof.

8. The method of claim 1, wherein adjusting the sensor layout further comprises adjusting a number of the plurality of sensors in the digital twin, adjusting a placement of the plurality of sensors in the digital twin, or a combination thereof.

9. A system comprising:

a processor; and a nontransitory computer-readable medium including instructions that are executable by the processor, wherein the instructions include:

defining a sensor layout of a digital twin based on one or more sensor parameters and one or more routing control locations of the digital twin, wherein the sensor layout includes a plurality of sensors;

simulating a manufacturing routine of a plurality of pallets and a plurality of workstations of the digital twin based on one or more pallet parameters associated with the plurality of pallets and one or more workstation parameters associated with the plurality of workstations, wherein the one or more pallet parameters include wherein the one or more pallet parameters include a pallet merging time associated with each routing control location of the one or more routing control locations, a pallet splitting time associated with each routing control location of the one or more routing control locations, one or more pallet travel times between the one or more routing control locations, or a combination thereof;

calculating, for each routing control location from among the one or more routing control locations, a transient production value and a steady state production value based on the manufacturing routine;

determining whether the transient production value is less than a threshold transient production value;

determining whether the steady state production value is greater than a threshold steady state production value in response to determining that the transient production value is less than the threshold transient production value; and adjusting the sensor layout of the digital twin in response to determining that the steady state production value is greater than the threshold steady state production value, wherein the steady state production value is equal to is equal to $|d_1/(d_1+d_2)-c_1/(c_1+c_2)|$, wherein $d_1$ is a first target production value associated with a first type of pallets from among the plurality of pallets, wherein $d_2$ is a second target production value associated with a second type of pallets from among the plurality of pallets, wherein $c_1$ is a number of the first type of pallets that have passed through a given routing control location, and wherein $c_2$ is a number of the second type of pallets that have passed through the given routing control location.

10. The system of claim 9, wherein the transient production value is based on the first target production value and the second target production value.

11. The system of claim 10, wherein the transient production value is based on a first number of the first type of pallets and a second number of the second type of pallets located between a first routing control location from among the one or more routing control locations and a destination.

12. The system of claim 11, wherein:

the transient production value is based on a routing control location ratio and a production ratio;

the routing control location ratio is based on a ratio of the first number and a sum of the first number and the second number; and the production ratio is based on a ratio of the first target production value and a sum of the first target production value and the second target production value.

13. The system of claim 9, wherein the one or more sensor parameters include a predetermined number of sensors of the plurality of sensors, and wherein the one or more workstation parameters include a cycle time associated with each workstation from among the plurality of workstations, a downtime associated with each workstation from among the plurality of workstations, or a combination thereof.

14. A method comprising:

defining a sensor layout of a digital twin based on one or more sensor parameters and one or more routing control locations of the digital twin, wherein the sensor layout includes a plurality of sensors;

simulating a manufacturing routine of a plurality of pallets and a plurality of workstations of the digital twin based on one or more pallet parameters associated with the plurality of pallets and one or more workstation parameters associated with the plurality of workstations, wherein:

the one or more pallet parameters include a pallet merging time associated with each routing control location of the one or more routing control locations, a pallet splitting time associated with each routing control location of the one or more routing control locations, one or more pallet travel times between the one or more routing control locations, or a combination thereof; and the one or more workstation parameters include a cycle time associated with each workstation from among the plurality of workstations, a downtime associated with each workstation from among the plurality of workstations, or a combination thereof;

calculating, for each routing control location from among the one or more routing control locations, a transient production value and a steady state production value based on the manufacturing routine, wherein:

the transient production value and the steady state production value are based on a first target production value associated with a first type of pallets from among the plurality of pallets and a second target production value associated with a second type of pallets from among the plurality of pallets;

iteratively adjusting the sensor layout of the digital twin until:

each transient production value from among the one or more transient production values is less than or equal to a threshold transient production value; and each steady state production value from among the one or more steady state production values is less than or equal to a threshold steady state production value, wherein adjusting the sensor layout comprises adjusting a number of the plurality of sensors in the digital twin, adjusting a placement of the plurality of sensors in the digital twin, or a combination thereof, wherein the steady state production value is equal to is equal to $|d_1/(d_1+d_2)-c_1/(c_1+c_2)|$, wherein $d_1$ is a first target production value associated with a first type of pallets from among the plurality of pallets, wherein $d_2$ is a second target production value associated with a second type of pallets from among the plurality of pallets, wherein $c_1$ is a number of the first type of pallets that have passed through a given routing control location, and wherein $c_2$ is a number of the second type of pallets that have passed through the given routing control location.

15. The method of claim 14, wherein:

the transient production value is based on a first number of the first type of pallets, a second number of the second type of pallets located between a first routing control location from among the one or more routing control locations and a destination, a routing control location ratio, and a production ratio;

the routing control location ratio is based on a ratio of the first number and a sum of the first number and the second number; and the production ratio is based on a ratio of the first target production value and a sum of the first target production value and the second target production value.

\* \* \* \* \*